United States Patent [19]

Aihara

[11] Patent Number: 5,502,830
[45] Date of Patent: Mar. 26, 1996

[54] CAMERA WITH MEMORY ADDRESS DESIGNATION FEATURE

[75] Inventor: Yoshihiko Aihara, Kanagawa, Japan

[73] Assignee: Canon Kabushiki Kaisha, Tokyo, Japan

[21] Appl. No.: 117,658

[22] Filed: Sep. 8, 1993

Related U.S. Application Data

[63] Continuation of Ser. No. 560,217, Jul. 25, 1990, abandoned, which is a continuation of Ser. No. 139,972, Dec. 31, 1987, abandoned.

[30] Foreign Application Priority Data

Jan. 12, 1987 [JP] Japan ........................ 62-3131

[51] Int. Cl.$^6$ .................... G06F 12/06; G03B 17/00
[52] U.S. Cl. .................. 395/421.07; 354/289.12; 354/217; 354/213; 364/965.76; 364/965.6; 364/965.7; 364/DIG. 2
[58] Field of Search ................. 364/DIG. 1, DIG. 2; 395/425; 354/217, 105, 215, 213, 21, 289.12

[56] References Cited

U.S. PATENT DOCUMENTS

| | | | |
|---|---|---|---|
| 2,995,729 | 8/1961 | Steele | 364/200 |
| 3,781,807 | 12/1973 | Saltini | 364/200 |
| 4,442,488 | 4/1984 | Hall | 364/200 |
| 4,503,501 | 3/1985 | Coulson et al. | 364/300 |
| 4,542,865 | 9/1985 | Yamada et al. | 242/205 |
| 4,603,382 | 7/1986 | Cole et al. | 364/200 |
| 4,638,430 | 1/1987 | Perra et al. | 364/300 |
| 4,644,494 | 2/1987 | Muller | 364/900 |
| 4,682,292 | 7/1987 | Bue et al. | 364/424 |
| 4,714,962 | 12/1987 | Levine | 358/209 |
| 4,718,041 | 1/1988 | Baglee et al. | 365/185 |
| 4,728,978 | 3/1988 | Inoue et al. | 354/289.1 |
| 4,738,526 | 4/1988 | Larish | 354/412 |
| 4,774,534 | 9/1988 | Kazumi et al. | 354/21 |
| 4,783,674 | 11/1988 | Ishikawa et al. | 354/289.1 |
| 4,802,119 | 1/1989 | Heene et al. | 364/900 |
| 4,912,492 | 3/1990 | Ishikawa et al. | 354/266 |
| 5,025,275 | 6/1991 | Taniguchi et al. | 354/106 |

*Primary Examiner*—Thomas G. Black
*Assistant Examiner*—Maria N. Von Buhr
*Attorney, Agent, or Firm*—Fitzpatrick, Cella, Harper & Scinto

[57] ABSTRACT

A memory device having a plurality of regions is provided with a designating circuit for performing data erasing and writing in a given memory region. A change circuit changes the memory region either after a predetermined number of erasing/writing cycles or in response to the number of times an operation member effects a detected state.

4 Claims, 4 Drawing Sheets

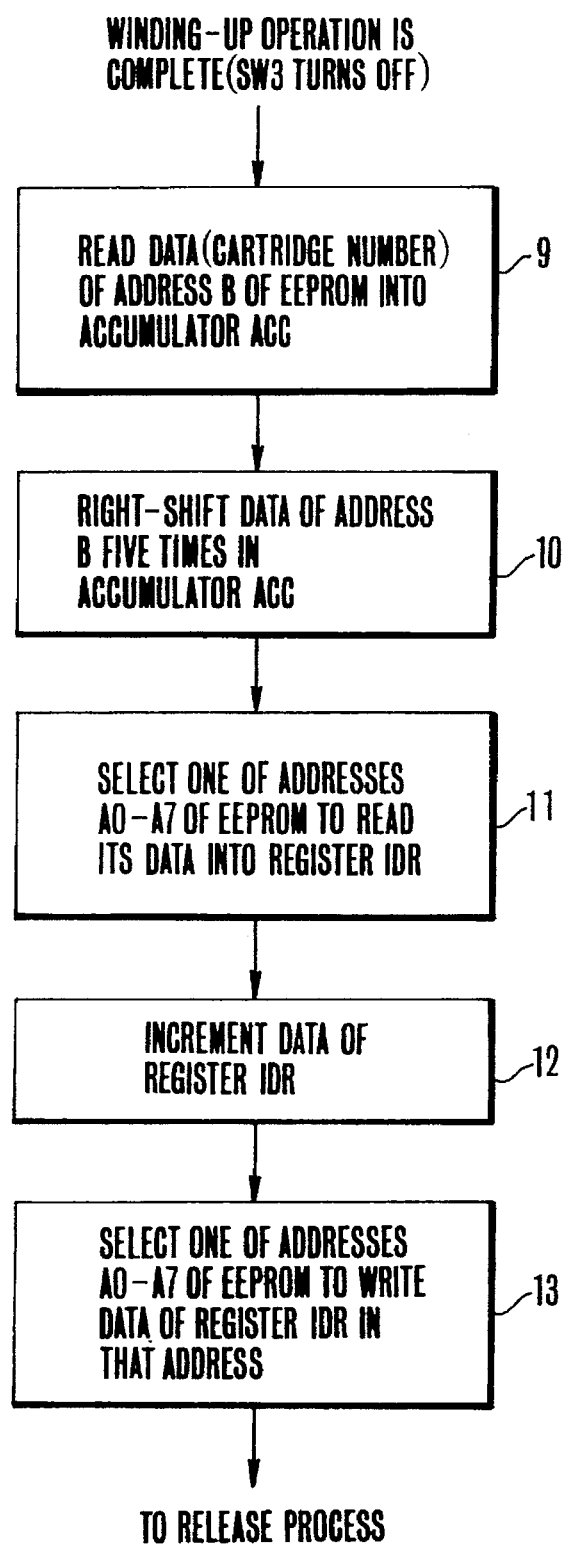

CAMERA WITH MEMORY ADDRESS DESIGNATION FEATURE

This application is a continuation, of application Ser. No. 07/560,217, filed Jul. 25, 1990, which is a continuation of Ser. No. 07/139,972, filed Dec. 31, 1987, both now abandoned.

BACKGROUND OF THE INVENTION

1. Field of the Invention

This invention relates to improvements in a memory device for storing data such as a number of film frames.

2. Description of the Related Art

Recently, in the field of cameras, as the application of electronics advances, an increasing number of means for memorizing the number of film frames and other various data to be used in control, counting, or display are taking an electrical form. Such an electrical memory means should have a storage medium capable of electrical writing and erasing. In this respect, use may be made of a solid state non-volatile memory element, such as an EEPROM (electrically writable and erasable programmable read only memory). Since, without the necessity of a backup battery for the electrical power source, an EEPROM retains the memory contents, it can be said that there is a very advantageous prospect. Whilst it does not suffer losing the once stored data, the EEPROM has, however, generally a rewrite life-time of about ten thousand maximum permissible number cycles, which is shorter than a RAM. Therefore, if the number of executed cycles of writing and erasing are unevenly concentrated in a particular portion of the storage area, it will not withstand a long-pending usage. Hence, a novel implementation of the EEPROM in order for it to be applied to the above-described purpose had to be made.

SUMMARY OF THE INVENTION

With the foregoing in mind, the present invention has been made, and its object is to provide a memory device comprising data content memory means for memorizing a data content, the data content memory means having a plurality of writable and erasable memory regions, write cycle number memory means for memorizing one of the number of cycles of writing in the data content memory means and a number corresponding thereto, and control means for changing over a memory region used for memorizing the data content between the plurality of memory regions of the data content memory means each time a memorized value of the write cycle number memory means reaches a prescribed value so that the plurality of memory regions of the data content memory means are used in rotation, whereby all the executed cycles of writing and erasing are prevented, in effect, from occurring more frequently in a particular one of the memory regions than in any of the others, thus improving the longevity of the memory device.

These and other objects of the invention will become apparent from the following description of an embodiment thereof.

BRIEF DESCRIPTION OF THE DRAWINGS

FIG. 2 is a diagram of the addresses and data memory regions of the EEPROM shown in FIG. 1.

FIGS. 3 and 4 are flowcharts for the operation of the circuit of FIG. 1.

DETAILED DESCRIPTION OF THE PREFERRED EMBODIMENT

Figure 1:
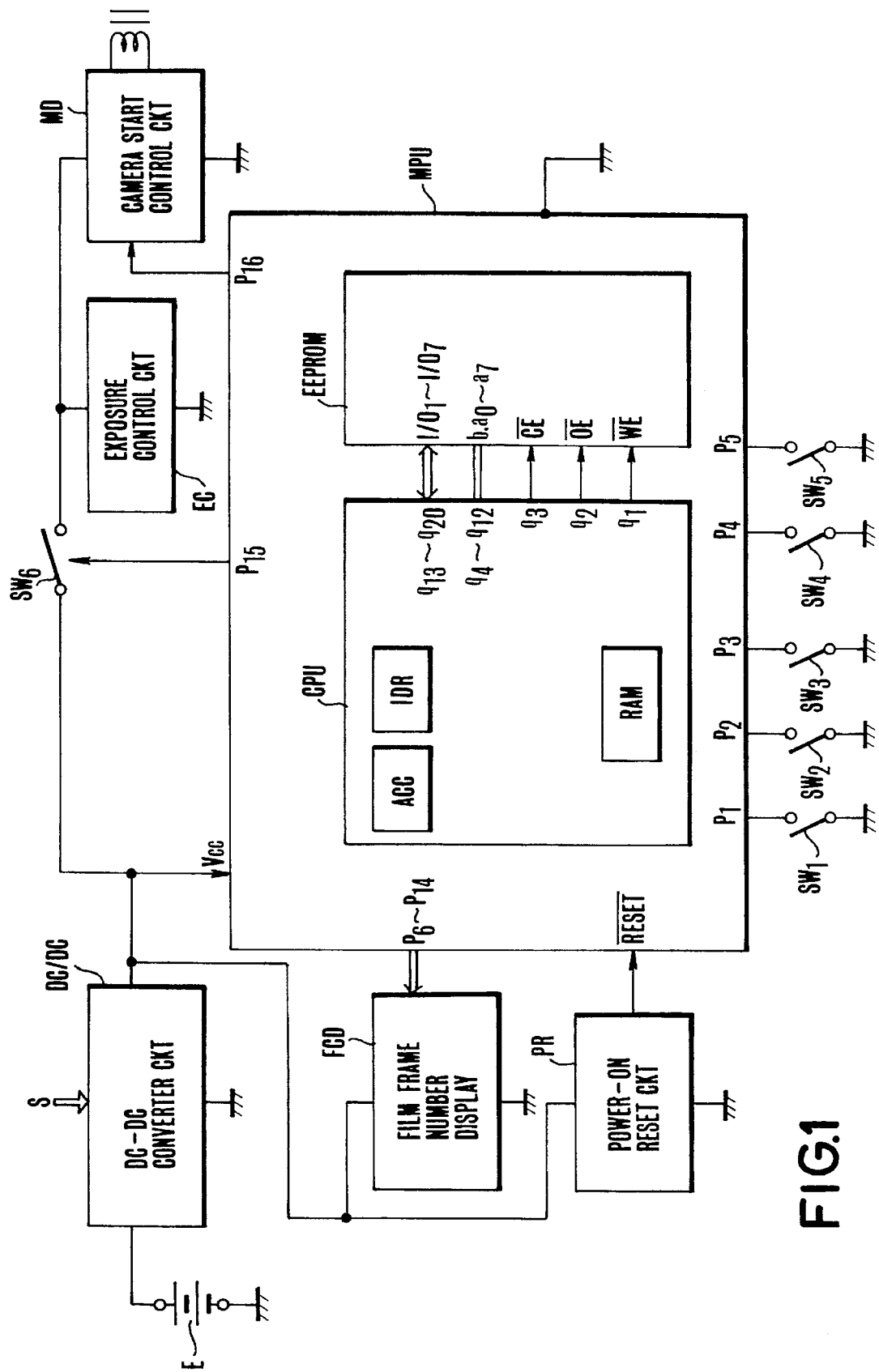
FIG. 1 is a block diagram showing an embodiment of the invention.

In FIG. 1, there is shown an embodiment of the invention.

MPU is a one-chip microcomputer of CMOS (complementary metal oxide semiconductor) structure and low power consumption having an EEPROM, a volatile memory RAM, an accumulator ACC and a register IDR incorporated therein. Particularly, the volatile memory RAM, accumulator ACC and register IDR are grouped in what is called a central processing unit (hereinafter abbreviated to CPU). The MPU has input/output ports $P_1$–$P_5$ which take a high level (hereinafter described as "H" level) in the initial state. On reception of a signal of a low level (hereinafter abbreviated to "L" level) at its $\overline{RESET}$ terminal from a power-on reset circuit PR, the MPU is reset to initialize the input/output ports $P_1$–$P_5$ to H level.

The first input/output port $P_1$ is connected to a switch SW1 which is turned on by a first stroke of a shutter button (not shown), or a so-called half-stroke switch. The second input/output port $P_2$ is connected to a release switch SW2 which is turned on by a second stroke of the same shutter button. The third input/output port $P_3$ is connected to a windup switch SW3 cooperating with the film in such a manner that it is turned on before the start of a winding operation, then off after the termination of the winding operation, and on again when the next exposure operation ends. The fourth input/output port $P_4$ is connected to a counter switch SW4 for detecting the completion of the film loading arranged to turn off when the back cover of the camera is opened and to turn on when the film is advanced the first two or three frames in vain after the back cover has been closed. The fifth input/output port $P_5$ is connected to a switch SW5 for sensing the locking of a battery chamber lid.

At its output ports $P_6$–$P_{14}$ which are connected to a film frame number display FCD, the MPU produces data pertaining to the number of exposed frames. When all the outputs of the ports $P_6$ to $P_{14}$ become H level, the film frame number display FCD is energized over the entire area. Another output port $P_{15}$ produces a signal for closing and opening a shutter release control switch SW6. When this signal changes from H to L level, the shutter control switch SW6 turns on to apply a constant voltage Vcc to an exposure control circuit EC and a camera start control circuit MD. Another output port $P_{16}$ produces a signal of H or L level which is applied to a solenoid equipped with a permanent magnet in the camera start control circuit MD. When this signal changes from H to L level, the magnetic field of the permanent magnet is cancelled to start a sequence of camera operations.

The CPU and EEPROM are formed on a common MPU chip and internally input/output ports $q_1$–$q_3$ of the former are connected respectively to terminals $\overline{WE}$, $\overline{OE}$, CE of the latter, input/output ports $q_4$–$q_{12}$ in a set to address selection terminals b and $a_0$–$a_7$ in a set, and input/output ports $q_{13}$–$q_{20}$ in a set to data input/output terminals I/O$_1$–I/O$_7$ in a set. When an actuating switch S accessible from the outside is operated, a DC-DC converter circuit DC/DC is actuated to boost the voltage of an electrical power source E to a constant voltage Vcc which is applied to the CPU, display FCD and reset circuit PR.

Here, though not directly related to the invention, the actuating switch S is briefly explained. Recently, the liquid crystal type of display of shutter speed, aperture value, frame number, and others is employed in the camera. In such a camera, if it were the practice that the display does not present the preset values of exposure factors except, for example, when the shutter button is pushed to the first stroke, it would be very inconvenient for the user. Therefore, the display is conventionally provided with a manually operable actuator in any form. To such a purpose, the actuating switch S is used (as, in this embodiment, arranged to turn on when the back cover is closed).

Figure 2:
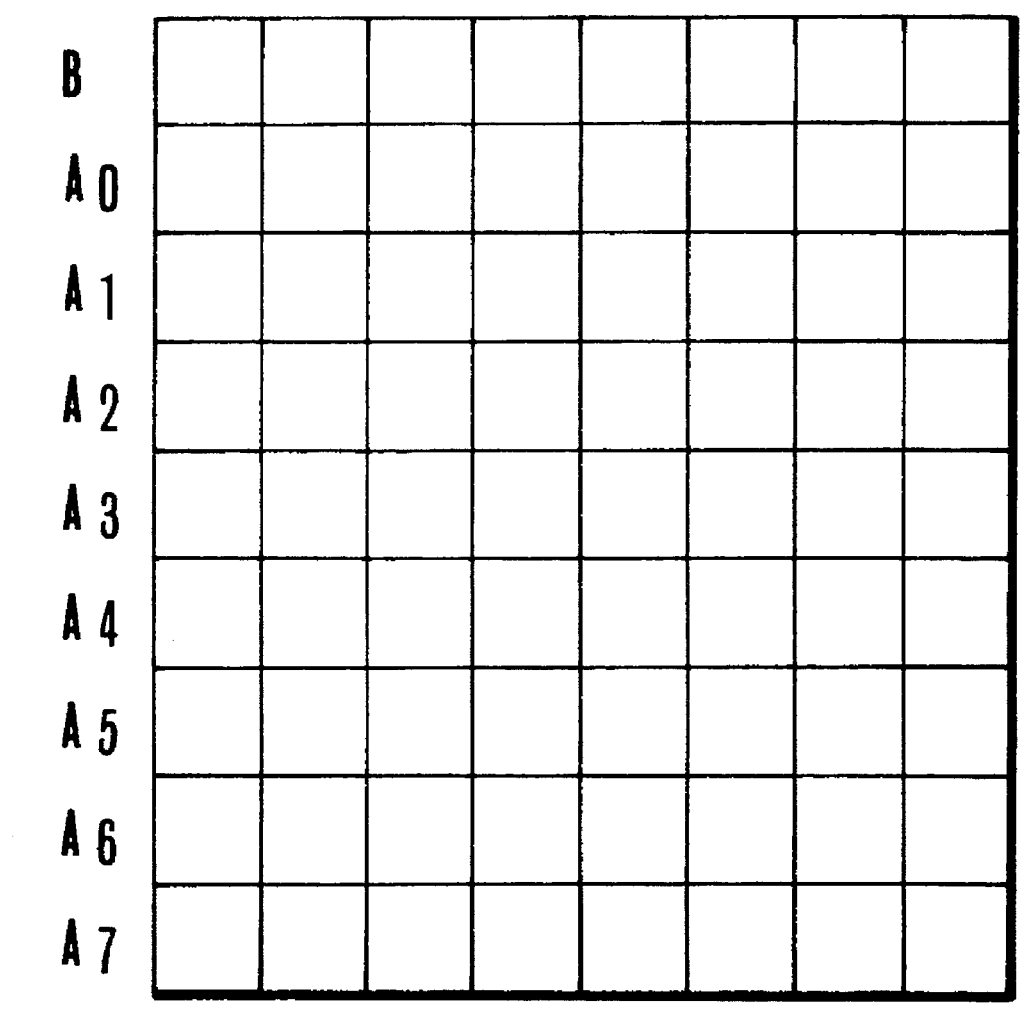

FIG. 2 shows addresses and data memory regions in which data are written. The data written in an address B represents the number of film cartridges used up to now. The other addresses $A_0$ to $A_7$ are selected one at a time to write the number of fed film frames in every film cartridge. It is also to be noted that the data is memorized in 8-bit binary form.

Next, the operation of the MPU is described. With respect to the operations of the film frame number display FCD, camera start and exposure control circuits MD and EC and shutter control switch SW6, the present invention has no direct relationship thereto. So, their explanation is omitted here.

Figure 3:
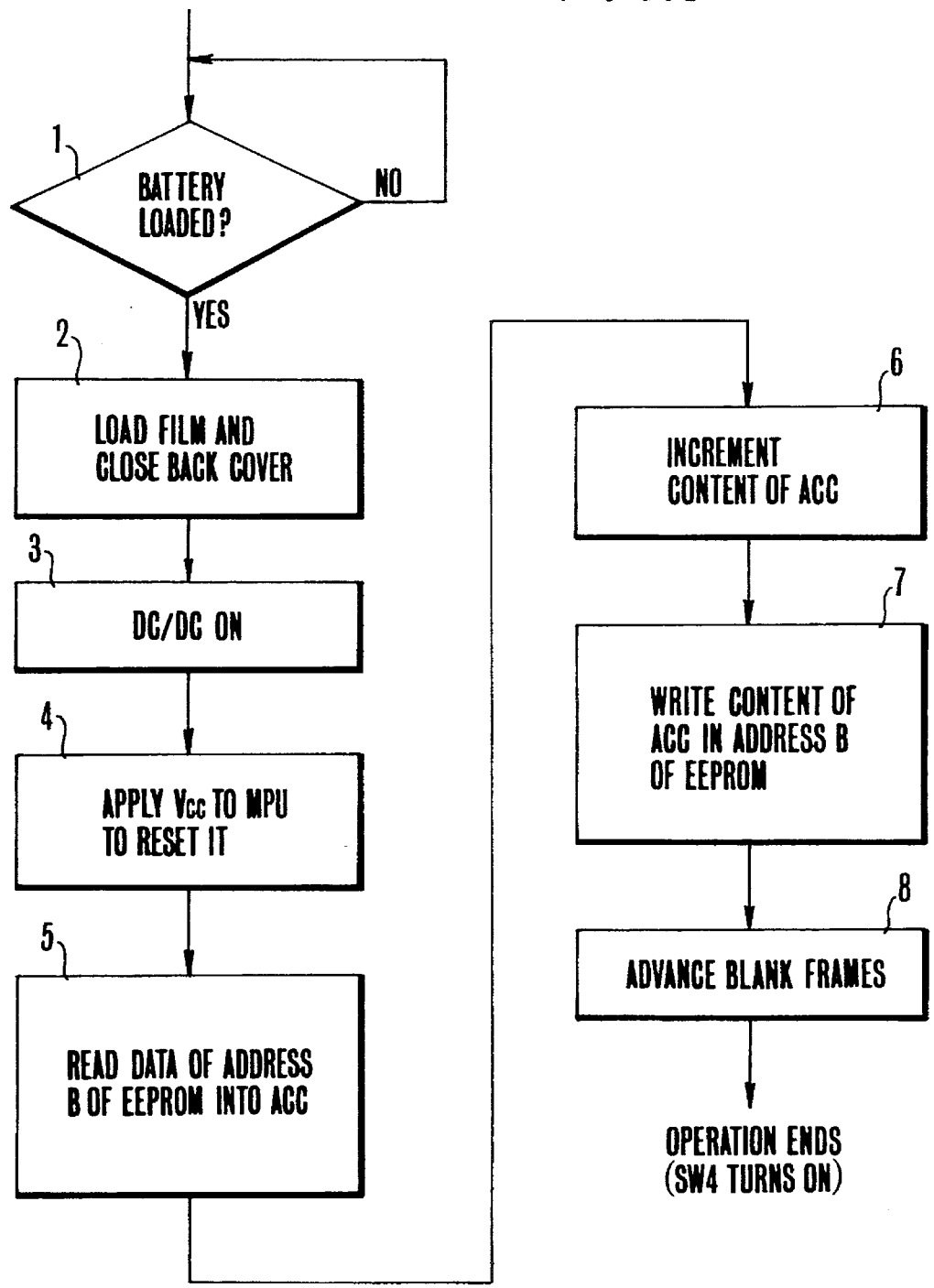

Referring first to the flowchart of FIG. 3,

Step 1: A battery having a sufficient voltage to activate the camera is loaded as the electrical power source.

Step 2: The back cover is opened, and the leader of the film is put in a certain position and the back cover is closed.

Step 3: In response to closure of the back cover, the actuating switch S is turned on to start an operation of the DC-DC converter DC/DC.

Step 4: The constant voltage Vcc produced at the output of the DC-DC converter DC/DC is applied to the MPU, film frame number display FCD and power-on reset circuit PR. In turn, the power-on reset circuit PR produces an output signal by which the MPU is reset.

Step 5: The potentials at the terminals $\overline{OE}$ and $\overline{CE}$ of the EEPROM are changed in sequence from H to L level through the input/output ports $q_2$ and $q_3$ so that the data of the number of used so far film cartridges stored in the memory region of the address B in the EEPROM is read into the accumulator ACC. After the reading has ended, the input/output ports $q_2$ and $q_3$ are changed again to a high level.

Step 6: Increment +1 the content of the accumulator ACC.

Step 7: The potentials at the terminals $\overline{CE}$ and $\overline{WE}$ of the EEPROM are changed in sequence from H to L level through the input/output ports $q_3$ and $q_1$ to give a voltage for a short time. For now, the renewed content of the accumulator ACC is written in the address B (the memory region corresponding to the address B) of the EEPROM. After this writing has ended, the input/output ports $q_1$ and $q_3$ are changed again to H level.

Step 8: After the writing of the film cartridge number data, the windup motor (not shown) is energized for a time necessary to advance the film by two or three blank frames. When such an automatic film loading operation terminates (thereupon the counter switch SW4 turns on), the shutter is made ready to release.

Next, using the flowchart of FIG. 4, an operation which follows the termination of the loading operation is described. It should be noted that, at that time, the windup switch SW3 has changed from ON to OFF state.

Step 9: through the input/output ports $q_2$ and $q_3$, the terminals $\overline{OE}$ and $\overline{CE}$ of the EEPROM are changed from H to L level in sequence. Thus, the data of the address B of the EEPROM is read in the accumulator ACC.

This data in the number of so far used film cartridges is now assumed to be, for example, (10101010).

Step 10: In the accumulator ACC, the data of the address B is right-shifted five times. This operation is to select one of the addresses $A_0$–$A_7$ which stores data in the number of exposed film frames. Since the data of the address B is (10101010), the content of the accumulator ACC becomes (00000101).

Step 11: Through the input/output ports $q_2$ and $q_3$, the terminals $\overline{OE}$ and $\overline{CE}$ of the EEPROM are changed from H to L level in sequence. Thus, the stored data of the film frame number from the EEPROM is read into the register IDR. In the EEPROM, the address to be used for reading in differs, depending on the content of the accumulator ACC obtained in the step 10 (see Table 1). For (00000101) of the accumulator ACC, the address $A_5$ of the EEPROM is selected. As the address $A_5$ has a data of (00011110), the same data or (00011110) enters the register IDR.

Step 12: Increment the data of the register IDR. It is here that the film frame number to be set is renewed or increased by one. Since the previous data of the register IDR was (00011110), the register IDR for now gets (00011111).

Step 13: Through the input/output ports $q_3$ and $q_1$, the terminals $\overline{CE}$ and $\overline{WE}$ of the EEROM are changed from H to L level in sequence, so that the data of the register IDR is written in the one of the addresses of the EEPROM which is determined depending on the content of the accumulator ACC obtained in the preceding step 10 (see Table 1). When the content of the accumulator ACC is (00000101), the data of (00011111) of the register IDR is written in the address $A_5$ of the EEPROM.

The 5-bit right shift of the data of the address B in the accumulator ACC means that the selection of whichever one of the addresses $A_0$–$A_7$ for writing the frame number data is controlled by the upper three significant bits of the data of the address B.

TABLE 1

| Lower 3-bit data in ACC | Address selected. |
| --- | --- |
| 0 0 0 | A0 |
| 0 0 1 | A1 |
| 0 1 0 | A2 |
| 0 1 1 | A3 |
| 1 0 0 | A4 |
| 1 0 1 | A5 |
| 1 1 0 | A6 |
| 1 1 1 | A7 |

As is understandable from the foregoing, the data representing the number of film cartridges (used ones) is memorized in the address B of the EEPROM. Each time the used-up film cartridge is replaced by a new one, the content of this address B is incremented one. Also, the number of exposed frames in the new cartridge is memorized in one of the addresses $A_0$–$A_7$. And, selection of a different one of the addresses $A_0 A_7$ for writing in the frame number data is started only when any one or ones of the values at the upper three bits of the 8-bit data of the address B (capable of memorizing up to 256 in the number of cartridges) changes or change, or each time the number of used cartridges reaches 32 (=256/8).

In more detail, so long as the 1st to 32nd film cartridges are used, a common one of the addresses, say $A_0$, is always selected to memorize the number of exposed frames (in every one cartridge). From the 33rd to the 64th cartridges, the next address $A_1$ is selected to memorize the number of exposed frames. From the 65th to the 96th one, the further next address $A_2$ is selected to memorize the number of exposed frames. In such a manner, the addressing is changed over from one to the next region. Then, after the content of the address B has reached (11111111) or a decimal number of 255, when the next cartridge is loaded, the content of the address B becomes (00000000). Hence, the selection of the addresses begins with the address $A_0$ again. It is also to be noted that the content of the selected one of the addresses $A_0$-$A_7$ is electrically erased each time the camera is loaded with a new cartridge. Hence, writing of the data of the film frame number starts with (00000001).

The film cartridges commercially sold in the market have 36 frames at maximum. Therefore, in one rotation of the content of the address B, each of the addresses $A_0$-$A_7$ is rewritten 1152 (=36×32) times at most. Since, as has been mentioned before, the EEPROMs have generally an ability to endure 10,000 recycles or more of the rewriting operation, at least 8 rotations are possible.

According to this embodiment, when writing the frame number data, the addressing is not one-sided, but made uniform over the entire memory regions. This produces a great advantage of increasing the longevity of the EEPROM.

Though, in this embodiment, the number of used film cartridges have been employed as the data of the address B, and, therefore, its upper three bits only must be chosen to control selection of the addresses $A_0$-$A_7$ for writing the frame number data, it is to be understood that the data usable to be written in the address B is not confined to the number of film cartridges. Any data which is correlated to the total sums of the numbers of exposed film frames but takes a smaller value than that, for example, the number of times the back cover of the camera is opened and closed, or the number of exchange of the battery, may be used.

Also, though a different one of the addresses $A_0$-$A_7$ is selected, after every 32 cartridges have been used, it may be effected for every one cartridge. Also, though the EEPROM has been exemplified as formed on the common chip of the CPU, it goes without say that the EEPROM may be formed in a separate chip.

Further, the application of the invention is not limited to film counters or cameras, but, it is needles to say that the invention is widely applicable to other instruments provided the data are written and erased repeatedly.

What is claimed is

1. A camera provided with a memory circuit having a plurality of addresses, comprising:

a) an information portion for storing an information value corresponding to a number of times that a new film cartridge is loaded in the camera;

b) an address designation circuit for designating addresses on the basis of the information value stored in said information portion, said designation circuit designating a different address each time that the information value in said information portion changes a predetermined number of times; and c) a control circuit for effecting at least one of writing and reading photographic information to and from the addresses designated by said address designating circuit.

2. A camera according to claim 1, wherein said control circuit writes in an information value of a number of film frames corresponding to every time one film frame is wound up.

3. A camera according to claim 1, wherein said information portion stores an information value corresponding to a number of times the film is loaded and auto loaded.

4. A camera according to claim 1, wherein said information portion stores an information value corresponding to a number of times a cover of a film loaded chamber is opened and closed.

* * * * *

UNITED STATES PATENT AND TRADEMARK OFFICE
CERTIFICATE OF CORRECTION

PATENT NO. : 5,502,830
DATED : March 26, 1996
INVENTOR(S) : YOSHIHIKO AIHARA

It is certified that error appears in the above-indentified patent and that said Letters Patent is hereby corrected as shown below:

COLUMN 3

Line 37, "$q_3$" should read --$q_3$,--.
Line 38, "of used so far film cartridges" should read --of film cartridges used so far--.
Line 63, "through" should read --Through--.

COLUMN 4

Line 59, "$A_0A_7$" should read --$A_0$-$A_7$--.

UNITED STATES PATENT AND TRADEMARK OFFICE
CERTIFICATE OF CORRECTION

PATENT NO. : 5,502,830 Page 2 of 2
DATED : March 26, 1996
INVENTOR(S) :
YOSHIHIKO AIHARA It is certified that error appears in the above-indentified patent and that said Letters Patent is hereby corrected as shown below:

<u>COLUMN 6</u>

Line 2, "say" should read --saying--.
    Line 5, "needles" should read --needless--.

Signed and Sealed this

Sixth Day of August, 1996

Attest:

BRUCE LEHMAN

Attesting Officer      Commissioner of Patents and Trademarks